United States Patent [19]

Kojima

[11] Patent Number: 5,446,298
[45] Date of Patent: Aug. 29, 1995

[54] SEMICONDUCTOR MEMORY DEVICE INCLUDING A FLOATING GATE HAVING AN UNDOPED EDGE PORTION PROXIMATE TO A SOURCE PORTION OF THE MEMORY DEVICE

[75] Inventor: Mitsuo Kojima, Kyoto, Japan

[73] Assignee: Rohm Co., Ltd., Kyoto, Japan

[21] Appl. No.: 300,984

[22] Filed: Sep. 6, 1994

Related U.S. Application Data

[63] Continuation of Ser. No. 92,892, Jul. 19, 1993.

[30] Foreign Application Priority Data

Jul. 22, 1992 [JP] Japan .................. 4-195481

[51] Int. Cl.$^6$ .................. H01L 29/36; H01L 29/78
[52] U.S. Cl. .................. 257/314; 257/316; 257/317; 257/336; 257/407; 257/391
[58] Field of Search .................. 257/156, 214, 219, 221, 257/315–322, 239, 250, 285, 287, 336, 344, 346, 408, 387, 391, 401, 314, 407, 317, 316

[56] References Cited

U.S. PATENT DOCUMENTS

| 4,742,491 | 5/1988 | Liang et al. .................. 257/322 |
| 4,994,873 | 2/1991 | Madan .................. 257/315 |
| 5,241,202 | 8/1993 | Lee .................. 257/317 |

FOREIGN PATENT DOCUMENTS

| 0124161 | 7/1984 | Japan .................. 252/407 |
| 0232765 | 9/1989 | Japan .................. 257/344 |

*Primary Examiner*—Rolf Hille
*Assistant Examiner*—Alexander Oscar Williams
*Attorney, Agent, or Firm*—Cushman, Darby & Cushman

[57] ABSTRACT

The present invention provides a semiconductor device including nonvolatile memories and a manufacturing method thereof which have advantages in reliability of writing operation and in erasing time of erasing operation. This semiconductor device comprises a silicon substrate 40, a N type drain 40 formed in the surface of the substrate 36, a N type source 36, a tunnel oxide layer 14 located on the surface of the substrate, and a floating gate located on the tunnel oxide layer 14, having a first portion 55 in side of the source 36 and a second portion 54 in both sides of the drain 40 and the substrate 2, the second portion 54 being of a lower N type dosage than the first portion 55.

13 Claims, 7 Drawing Sheets

SEMICONDUCTOR MEMORY DEVICE INCLUDING A FLOATING GATE HAVING AN UNDOPED EDGE PORTION PROXIMATE TO A SOURCE PORTION OF THE MEMORY DEVICE

This is a continuation of application Ser. No. 08/92,892, filed on Jul. 19, 1993, which was abandoned upon the filing hereof.

BACKGROUND OF THE INVENTION

1. Field of the Invention

The present invention relates to a semiconductor device and, more particularly, a semiconductor device including nonvolatile memories.

2. Description of the Related Art

Nowadays, an electrically erasable programmable read only memory ($E^2PROM$) of flash type (flash memory hereafter) is known as memory where data is able to be rewritten by using electricity.

The flash memory having a control gate electrode, a floating gate electrode, a source and a drain is characterized in that data stored in the floating gate can be electrically erased using a thinner gate insulating layer between the floating gate and the source or drain.

A conventional method for manufacturing this flash memory will be described below.

Referring to FIG. 1A, an entire surface of a silicon substrate 2 is oxidized to form a silicon oxide layer 4 on the silicon substrate 2.

Referring to FIG. 1B, field oxide layers 10 are formed in the entire surface of the silicon oxide layer by Local Oxidation of Silicon (LOCOS) technique to divide the substrate 2 into the plural insulated islands 12.

The substrate 2 is subjected to a injection step to adjust conductivity of what is to be channel regions.

The resulting substrate 2 is subjected to a heat treatment to form the surface of the insulated islands 12 into the tunnel oxide layer 14. A first polysilicon layer 16 is applied on the resulting substrate 2 using chemical vapor deposition (CVD) technique as shown in FIG. 1C.

The entire first polisilicon layer 16 is ion implanted with phosphorus thereby making the first polisilicon layer 16 N+ type.

Referring to FIG. 1D, thereafter on the first polysilicon layer 16 is formed a ONO layer 18 comprised of an oxide layer, a nitride layer and an oxide layer, a second polysilicon layer 20 is formed on the ONO layer 18 using the CVD technique. Similarly, phosphorus is ion-implanted and thereby making the second polysilicon layer 20 N+ type.

The resulting substrate 2 is subjected to a etch using a resist pattern as a mask to form a control gate electrode 26, an intervene insulating layer 24 and a floating gate 22.

Thereafter, what is to be a drain, and a surface of the control Gate electrode in side of drain are covered with a resist 30. Phosphorus is ion-implanted in such a direction as shown an arrow mark 32 using the resist 30 as a mask so that a region 38 of N− type may be created in the surface of silicon substrate 2 as shown in FIG. 2B. Then, after removing the resist 30, arsenic is implanted into the entire surface of substrate 2 with a low dosage of $2 \times 10^{15}$ per $cm^2$ so that a source comprised of the region 38 and a N+ type region 36, and a drain 40 of N+ type may be formed.

At last, the resulting substrate 2 is subjected to a step for protective layers, a wiring step and passivation step to complete the flash memory.

The flash memory as manufactured in the above fashion is used as a memory circuit having memory cells arrayed in rows by column as shown in FIG. 3. Referring to FIG. 3, in order to write data into a memory cell C11 which is to be desired, a high positive voltage is applied to a word line W1, a high positive voltage is applied to a bit line B1 and a voltage of 0 volts is applied to all of a source line S, a bit line B2 and a word line W2. At that time some of hot electrons develop by the drain 40 and then tunnel the tunnel oxide layer 14 acted as electric barrier, and enter into the floating Gate 22. The memory cell C11 in this state referred to as memory cell in "write state".

However, the above-mentioned flash memory has a problem with "wrong erasing" at writing operation.

Specifically, referring to the memory cell C13 at writing operation, the floating gate 22 is in a potential of 0 volts and the drain 40 is in a positive potential of the high voltage because the voltage of 0 volts is applied to the word line W2 and the positive high voltage is applied to the bit line B1. Meanwhile, the dosage of phosphorous is high in the entire first polysilicon layer 22. Therefore, the floating gate 22 has its own high conductivity, which lead to the fact that a rate of partial pressure to the tunnel oxide layer 14 is large. As the result of this, in the memory cell C13 electrons in the floating gate 22 may be drawn into the drain due to power of electric field. Thus, during the writing operation, data is erroneously erased from the memory cell C13.

To overcome this problem, there is an idea of lowering the dosage of phosphorous in the floating gate 22. However, a memory circuit made using this idea has a bad fact in that it takes a long time to erase a desired memory cell. That is, because decreasing the dosage of phosphorous decreases the rate of the partial pressure to the tunnel oxide layer 14, and the power of an electric field between the floating gate 22 and the source 36, 38 is weak.

Also, the above-mentioned flash memory has another problem. "Oxide ledge" occurs between the first polysilicon layer 22 and the tunnel oxide layer 14 because the first polysilicon has phosphorous of a high dosage. This "oxide ledge" cause a problem with "wrong erasing" due to a margin of electric field between the floating gate 22 and the source 36, 38 developed when data is erased from the flash memory cells.

SUMMARY OF THE INVENTION

It is an object of the present invention to provide a semiconductor device including nonvolatile memories and a manufacturing method thereof which have advantages in reliability of writing operation and in erasing time of erasing operation.

According to one embodiment of the present invention, a semiconductor device including nonvolatile memories comprises:

a) a substrate of semiconductor b) a drain of a first conductivity type formed in the surface of the substrate, c) a source of the first conductivity type formed in the surface of the substrate so that the source defines a space between the drain and the source, d) a gate insulating layer formed on the surface of the substrate, and e) a floating gate spanning the space on formed the gate insulting layer, having a first portion in side of the source and a second portion in both sides of the drain and the substrate, the second portion being of a lower dosage of the first conductivity type than the first portion.

According to another embodiment of the present invention, a method for manufacturing a semiconductor device including nonvolatile memory having a floating gate, a source and a drain comprises:

(a) a first implantation step of ion implanting a first layer for the floating gate with a first conductivity type dopant so that an above portion of the first layer is a first conductivity type region, and (b) a second implantation step of forming the first layer into the floating gate and ion implanting the floating gate with the first conductivity type dopant in such a direction that a first portion of the floating gate inside of the source is a first conductivity type region.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
FIGS. 1A through 1D are sectional views showing a method for manufacturing a flash memory according to a prior art.
Figure 1:
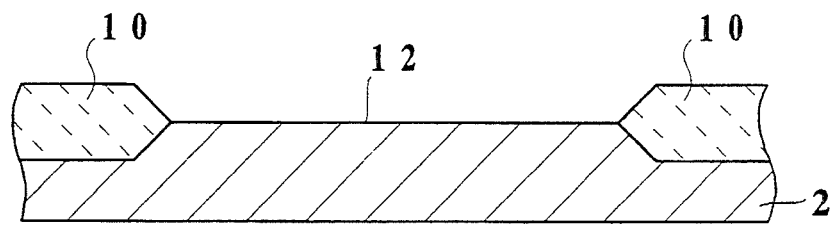
Figure 1:
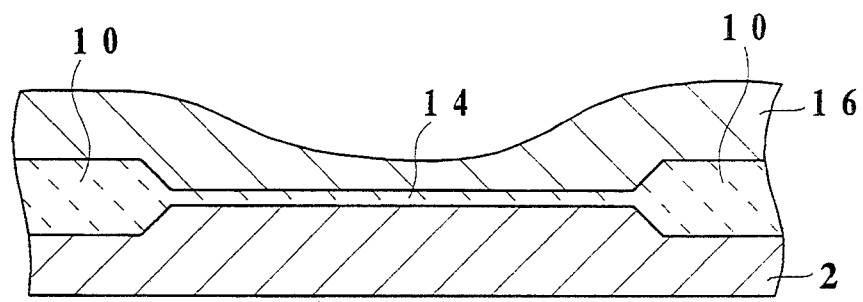
Figure 1:
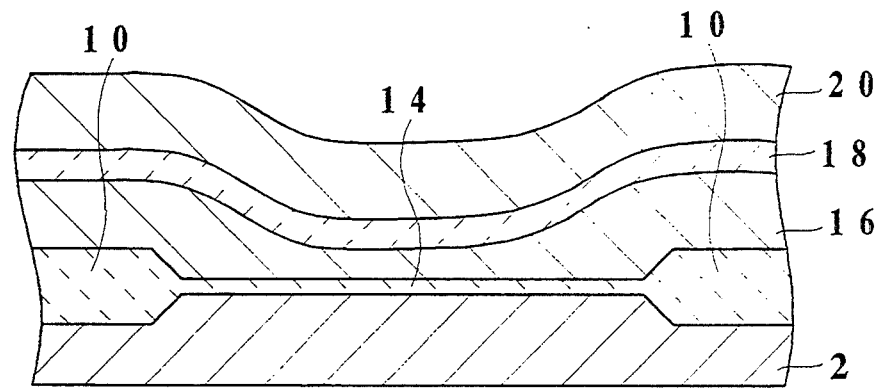
Figure 2:
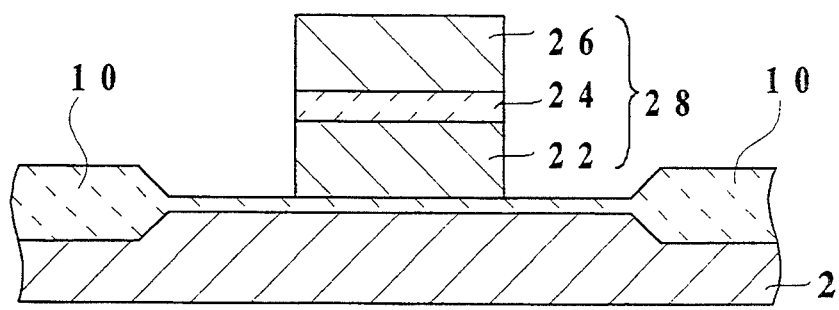
FIGS. 2A through 2C are sectional views showing the method for manufacturing the flash memory according to the prior art.
Figure 2:
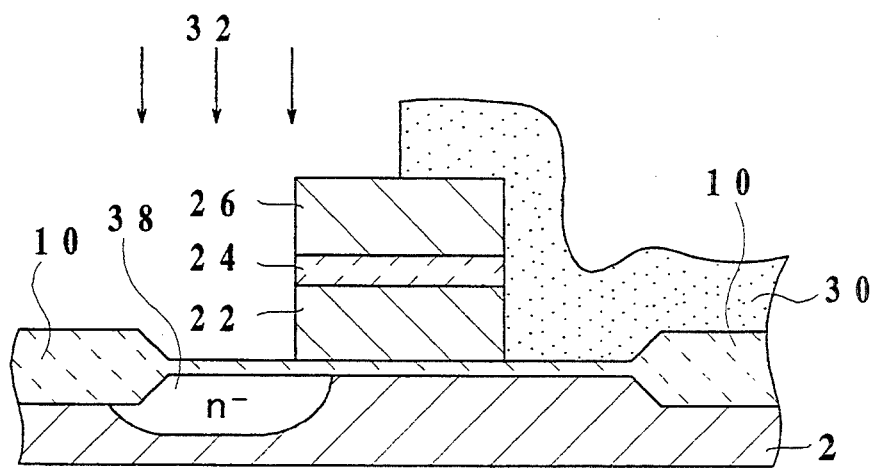
Figure 2:
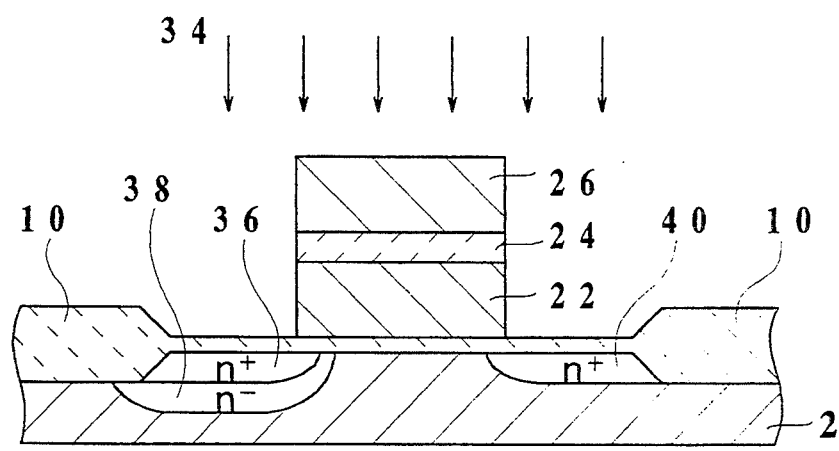
Figure 3:
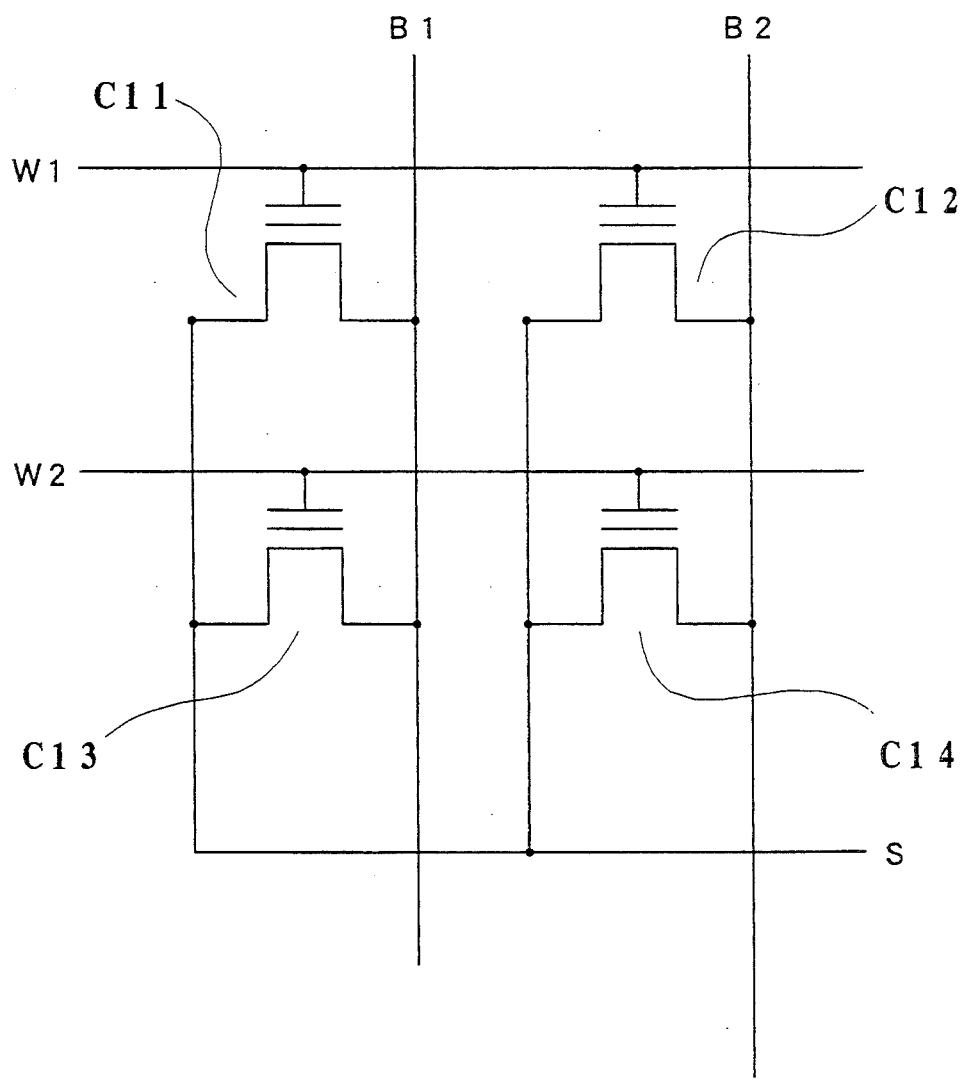
FIG. 3 is a partial equivalent circuit showing the flash memory according to the prior art.
Figure 4:
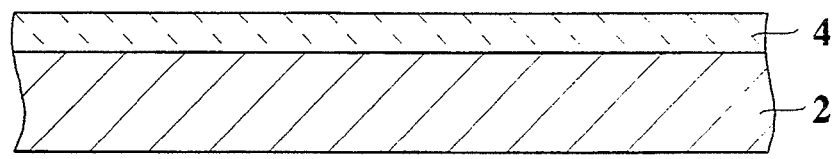
FIGS. 4A through 4D are sectional views showing a method for manufacturing a flash memory according to the other embodiment of the present invention.
Figure 4:
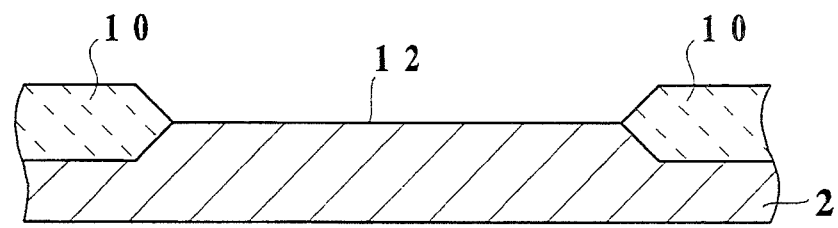
Figure 4:
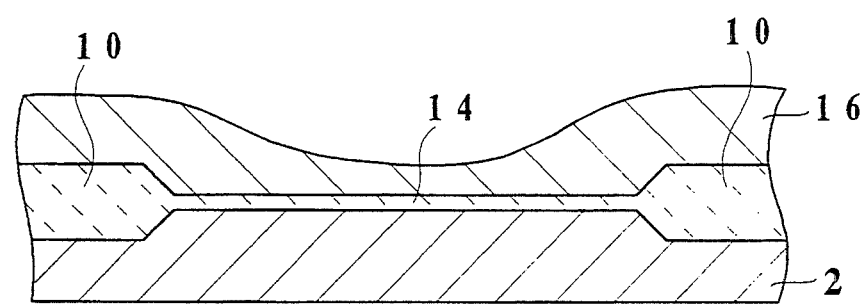
Figure 4:
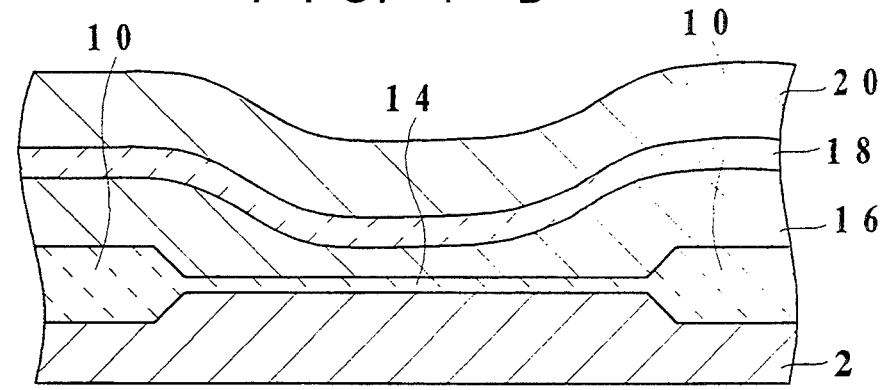
Figure 5:
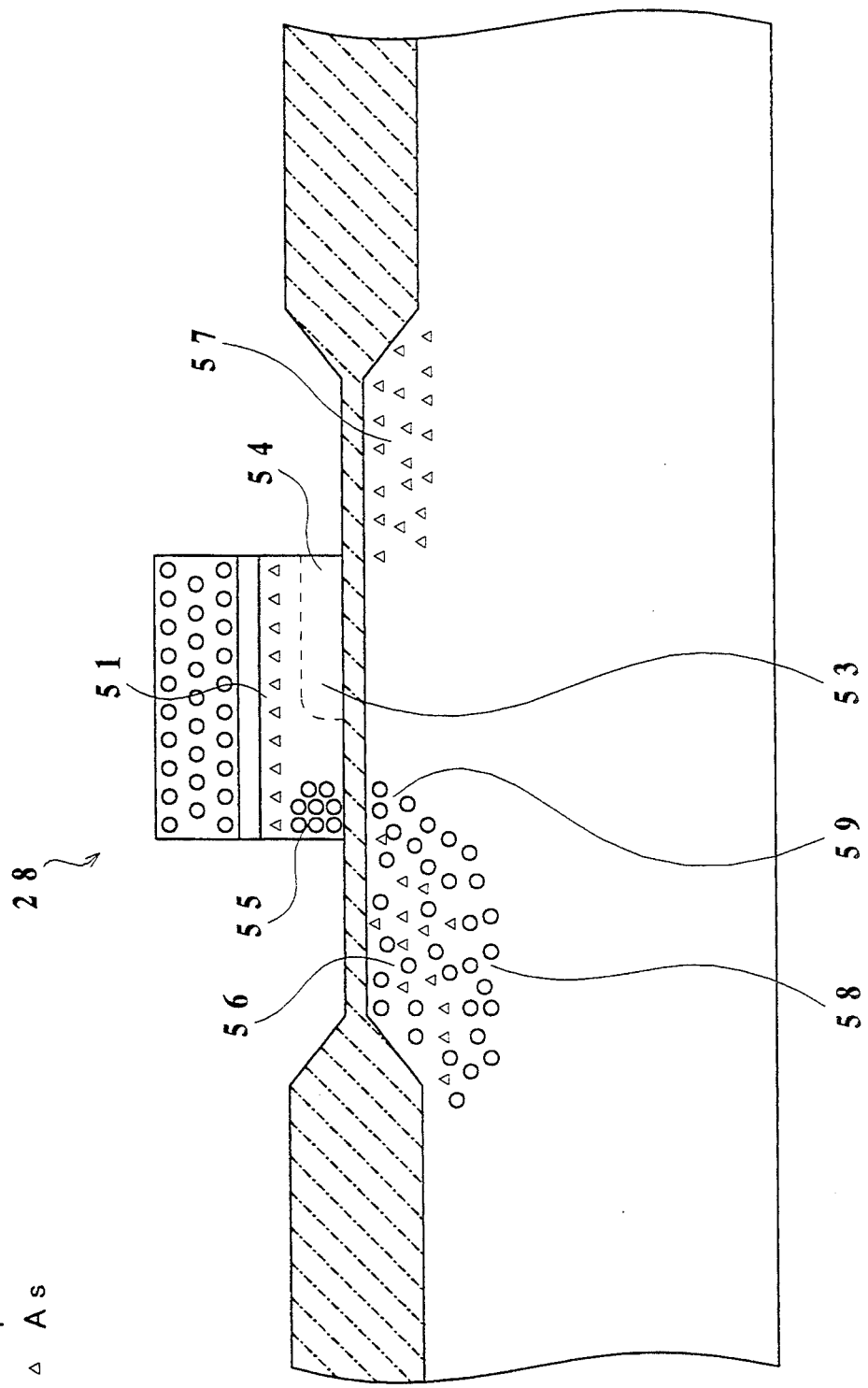
FIG. 5 is a sectional view schematically showing the flash memory for explaining the first and the second implantation steps.
Figure 6:
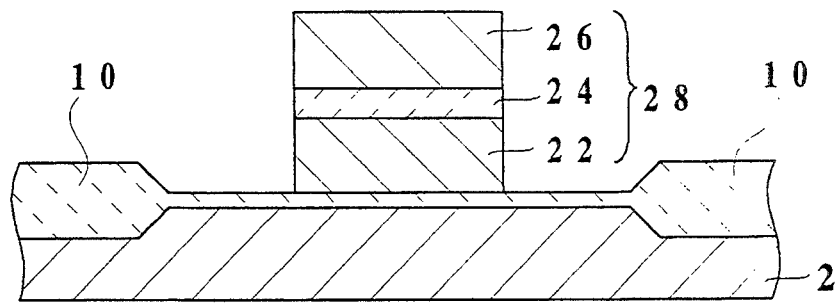
FIGS. 6A through 6C are sectional views showing the method for manufacturing the flash memory according the other embodiment of the present invention.
Figure 6:
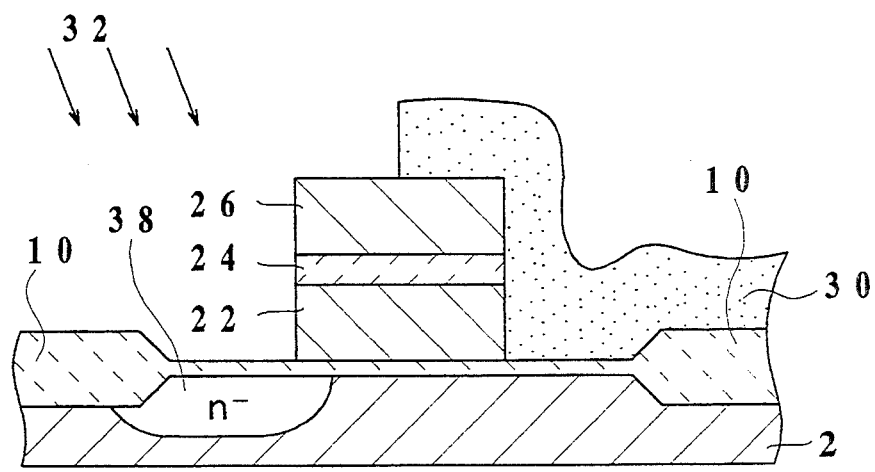
Figure 6:
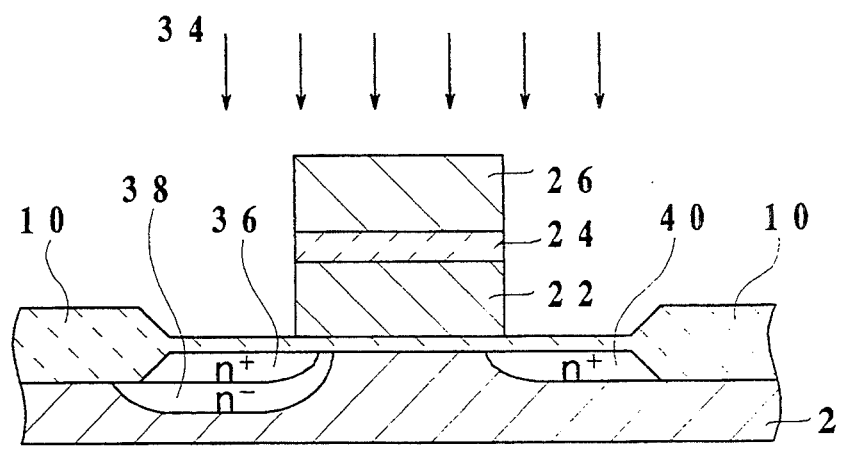

There will be described below a flash memory which is one of semiconductor devices including nonvolatile memories and a manufacturing method thereof according to one embodiment of the present invention with reference to FIGS. 4A–7.

Referring to FIG. 4A, an entire surface of a silicon substrate 2 which is a substrate of semiconductor is oxidized to form a silicon oxide layer 4 on the silicon substrate 2.

Referring to FIG. 4B, field oxide layers 10 are formed in the entire surface of the silicon oxide layer by Local Oxidation of Silicon (LOCOS) technique to divide the substrate 2 into plural insulated islands 12. Thereafter, boron is ion implanted at about 40 KeV at a dosage of $1 \times 10^{16}$ per cm$^2$ to adjust conductivity of what is to be channel regions.

The resulting substrate 2 is subjected to a heat treatment to form the surface of the insulated islands 12 into a tunnel oxide layer 14 of 10 nm which is a gate insulating layer. A first polysilicon layer 16 which is a first layer for a floating gate is applied on the entire surface of the resulting substrate 2 using CVD (chemical vapor deposition) technique as shown in FIG. 4C.

The resulting substrate 2 is subjected to a first implantation step wherein the entire surface of the first polysilicon layer 16 is ion implanted with arsenic of a first conductivity type dopant at about 30 KeV at a dosage of $1 \times 10^{16}$ per cm$^2$, so that an above portion 51 of the first polysilicon layer is N+ type region which is the first conductivity type region. Therefore, the remaining portion 53 is not to be a N+ type region.

Referring to FIG. 4D, the entire surface of the first polysilicon layer 16 is oxidized to form it into an oxide layer, an nitride layer is applied thereon using the CVD technique and the entire surface of the nitride layer is oxidized to form it into an oxide layer.

Thus, a ONO layer 18 comprised of the oxide layer, the nitride layer and the oxide layer is formed on the first polysilicon layer 16. A second polisilicon layer 20 is formed on the ONO layer 18 using the CVD technique.

Phosphorus is ion implanted at such a dosage that the second polysilicon layer 20 is made N+ type to increase conductivity thereof.

Referring to FIG. 6A, thereafter the resulting substrate 2 is subjected to a etch using a resist pattern (not shown) as mask to form a gate body 28 comprised of a control gate electrode 26, an intervene insulating layer 24 and a floating gate 22.

Referring to FIG. 6B, thereafter a resist 30 covers what is to be a drain, and a surface of the control gate electrode 26 in side of what to be the drain. Using the resist 30 as mask, the resulting substrate 2 is subjected to a second implantation step wherein phosphorous is ion implanted at about 100 KeV at a dosage of $3 \times 10^{14}$ per cm$^2$ in a direction of a angle of 45° relative to the surface of the substrate 2 which is one of such directions that a first portion 55 of the floating gate 22 in side of what is to be a source is the first conductivity type region. Specifically, this second implantation step is implemented as the resulting substrate 2 is being rotated with inclined in an ion-implanting machine at an angle of 45° relative to the horizontal.

As a result of this second implantation, the first portion 55 of the floating gate 22 has been a N-region which is one of first conductivity type regions. At that time, there is a larger dosage of the first conductivity type in the first portion 55 than in a second portion 54 which is in both sides of what is to be the drain and the substrate 2.

As is described above, after the resist 30 covers what is to be the drain and a surface of the control gate electrode 26 in side of what is to be the drain, phosphorous is ion implanted in the direction of the angle of 45° relative to the surface of the substrate 2, whereby the first portion 55 is ion implanted with phosphorous without ion implanting the second portion 54 of the floating gate 22.

As a result of this second implantation, in the surface of the substrate 2 is formed an N− type implanted region 58 and an N− type implanted region 59 under the gate body 28 without making what is to be the drain a N− type implanted region. Noted that depth of the source depends on the energy of ion implantation.

After removing the resist 30, the substrate 2 is subjected to a third implantation step wherein arsenic is ion implanted in an above direction shown an arrow mark 34, specifically, at about 60 KeV at a dosage of $5 \times 10^{15}$ per $cm^2$, thereby forming implanted regions 56 and 57 of N+ type in the surface of the substrate. Noted that preferred dosage in this third ion implantation is more than $3 \times 10^{15}$. At a result of this third implantation step, in the surface of the substrate 2 is formed a source 36 which is comprised of the N+ type region 56 and N− type regions 58 and 59 adjacent to the N+ type region 56, and a drain 40 of N+ type region 57 as shown in FIG. 6C (see FIG. 5).

The source 36 and the drain 40 serves as implanted region of N+ type because arsenic is ion implanted so that the source 36 and the drain 40 have the N+ type region 56 and the N+ type region 57.

Also, the source 36 have advantages in breakdown voltage because the source 36 is comprised of the N+ type implanted region and the N− type implanted regions 58 and 59 adjacent to the N+ type region 56.

Phosphorous used in the second implantation step is large in diffusion coefficient compared with arsenic used in the third implantation step. Therefore, it is easy to form the N+ type region and the N− type regions 58 and 59 adjacent of the N+ type region 56 in the surface of the substrate 2.

Thereafter, a protective insulating layer 42 of Boro-Phospho-Silicate-Glass (BPSG) is applied on the entre resulting substrate using CVD technique and then an opening for an electrode to be attached to the drain 40 is created in the protective insulating layer 42. A layer of silicon aluminum is deposited on the surface of the resulting substrate 2 and is formed into wires.

Figure 7:
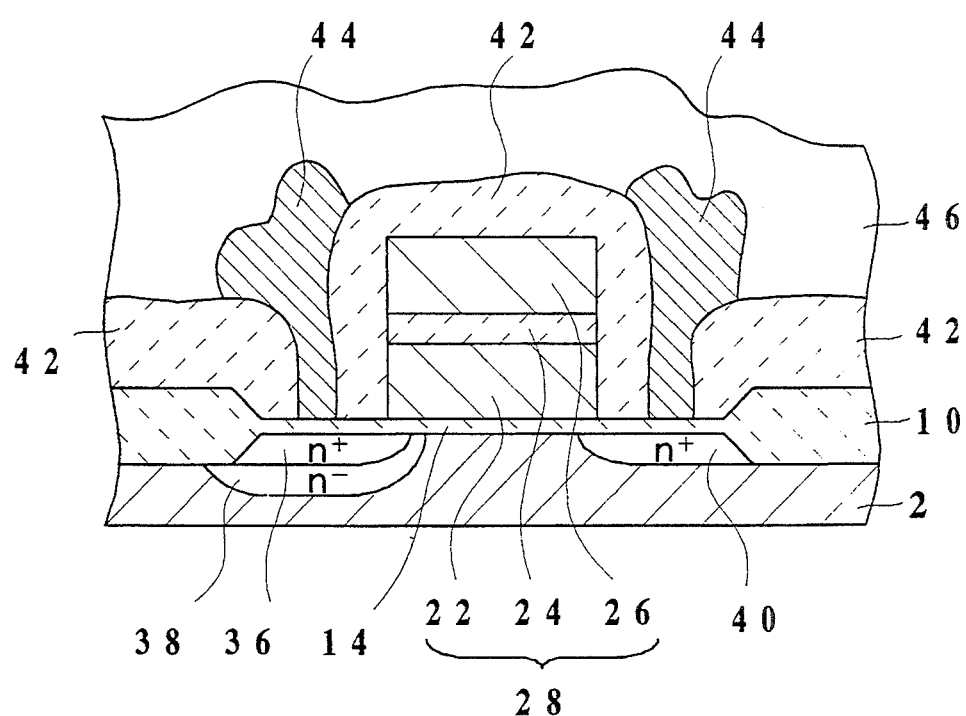
FIG. 7 is a sectional view showing the flash memory according to one embodiment and the other embodiment of the present invention.

At last, a layer (not shown) of passivation is formed on the entire surface of the resulting substrate as shown in FIG. 7.

The flash memory as manufactured in the above fashion is used as a memory circuit having memory cells arrayed in rows by column.

Although in this embodiment the present invention is applied to the flash type memory, in alternative embodiments the present invention may be applied to a semiconductor device including other type nonvolatile memories.

Although in the preferred embodiment the first conductivity type has been assumed to be N type, in alternative embodiments the first conductivity may also be P type.

Although in this embodiment boron is used as P type dopant and phosphorous and arsenic are used as N type dopant, in alternative embodiments other atoms may be used as dopant. Also, in alternative embodiments boron, phosphorous and arsenic may be ion implanted at an energy of another value at a dosage of another dosage providing that the first, second and third implantation steps are completed.

Although in the second implantation step of this embodiment phosphorous is ion implanted in the direction of the angle of 45° relative to the surface of the substrate 2, in alternative embodiments phosphorous may be ion implanted in a direction of another angle such as 40° or 50° providing that the first portion 55 of the floating gate 22 is the first conductivity type region.

Note that the second implantation step is implemented as the substrate 2 is being rotated. Therefore, the resist 30 is used to prevent phosphorous from implanting the second portion 54 of the floating gate 22 which is in both sides of the drain 40 and the substrate 2. In alternative embodiments, what is to be the drain 40 and the surface of the control gate electrode 26 in side of the drain 40 may not be covered with the resist 30 when the second implantation step is implemented without rotating the substrate 2.

Although in the second implantation step of this embodiment, phosphorous is ion implanted in the direction oblique to the surface of the substrate in order to form the first implanted portion 55, in an alternative embodiment any other technique may be used providing that the first portion 55 of the floating gate 22, which is inside of the source 36 is made N+ type.

Although in the above embodiment the ONO layer comprised of the oxide layer, the nitride layer and the oxide layer is used between the floating gate 22 and the control gate electrode 26, in alternative embodiments any other layer may be used providing that the layer is made of insulating material.

Although in the above embodiment the tunnel oxide layer is used as the gate insulating layer, in alternative embodiments any other insulating materials may form into the gate insulating layer.

In the above described embodiment, the second portion 54 of the floating gate 22 which is in both sides of the drain 40 and the substrate 2 is lower in dosage of dopant because of implement of the first and second implantation steps. When this flash memory is subjected to writing operation wherein a positive voltage is applied to the drain 40 relative to the control gate electrode 26 to write data into a desired memory cell, the problem with "wrong erase" can be overcome using this fact. That is, because of the fact decrease the rate of partial pressure to the tunnel oxide layer 14 is decreased.

In the above described embodiment, the first portion 55 of the floating gate 22 which is inside of the source 36, is larger in dosage of dopant because of the third implantation step, When a positive voltage is applied to the source 36 during the erasing operation, a rate of partial pressure to the tunnel oxide layer 14 is larger. Therefore, the erasing time can be shortened. This fact lead to another, fact holes developed in the source 36 during erasing operation decrease relatively. As holes developed in the source 36 during the erasing operation decrease, holes trapped in the tunnel oxide layer 14 also decrease. That is, the fact can prevent the tunnel oxide layer 14 from deteriorating and thereby the flash memory improves in number of operating.

In the above described embodiment, the dosage of phosphorous with which the floating gate 22 is ion implanted is lower on the average, particularly, the second portion 54 of the floating gate 22, which is in both sides of the drain 40 and the substrate 2. Therefore, "oxide ledge" is prevented from occurring between the floating gate 22 and the tunnel oxide layer 14. As a result, there is a decreased margin of electric field between the floating gate 22 and the source 36 developed when data is erased from desired flash memory cells.

In the above described embodiment, the drain 40 is comprised of the region 57 of N+ type. Therefore, when data is written into a desired memory cell, more hot electrons occur than when the drain 40 was a N− type region. That is, because a large electric field is developed between the drain 40 and the substrate 2. This fact improves the writing speed of the flash memory.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including nonvolatile memories comprising:
   a) a substrate of semiconductor;
   b) a drain of a first conductivity type located in the surface of the substrate;
   c) a source of the first conductivity type located in the surface of the substrate so that the substrate defines a space between the drain and the source;
   d) a first insulating layer located on the surface of the substrate;
   e) a floating gate located on the first insulating layer, the floating gate having an upper region and a lower region under the upper region, the lower region having top portion proximate to the upper region, a bottom edge portion opposite the top portion, a first edge portion at a first side proximate to the source and a second edge portion at a second side opposite the first side and proximate to the drain, the first edge portion being doped, the second edge portion being injected with substantially no dopant;
   f) a second insulating layer located on the floating gate; and
   g) a control electrode located on the second insulating layer.

2. A semiconductor device including nonvolatile memories according to claim 1,
   wherein the drain is a N+ type region.

3. A semiconductor device including nonvolatile memories according to claim 1,
   wherein the drain is a P+ type region.

4. A semiconductor device including nonvolatile memories according to claim 1,
   wherein the source is comprised of a N+ type region and a N− type region surrounding the N+ type region.

5. A semiconductor device including nonvolatile memories according to claim 1,
   wherein the source is comprised of a P+ type region and a P− type region surrounding the P+ type region.

6. A semiconductor device including nonvolatile memories according to claim 4,
   wherein the upper portion of the floating gate is comprised of a N+ type region.

7. A semiconductor device including nonvolatile memories according to claim 6,
   wherein the first portion of the floating gate is comprised of a N− type region.

8. A semiconductor device including nonvolatile memories according to claim 7,
   wherein the N− type regions are formed by ion implanting using phosphorous as a dopant, and the N+ type regions are formed by ion implanting using arsenic as a dopant.

9. A semiconductor device including nonvolatile memories according to claim 2,
   wherein the source is comprised of a N+ type region and a N− type region surrounding the N+ type region.

10. A semiconductor device including nonvolatile memories according to claim 3,
    wherein the source is comprised of a P+ type region and a P− type region surrounding the P+ type region.

11. A semiconductor device including nonvolatile memories manufactured by a method including the following steps:
    a) forming a first insulating layer on a substrate of semiconductor,
    b) forming a first polysilicon layer on the first insulating layer,
    c) implanting a dopant of a first diffusion coefficient so as to be diffused into only an upper side of the first polysilicon layer,
    d) forming a second insulating layer on the first polysilicon layer,
    e) forming a second polysilicon layer on the second insulating layer,
    f) forming plural stacking layers having side surfaces on the substrate by etching the first insulating layer, the first polysilicon layer, the second insulating layer, and the second polysilicon layer,
    g) implanting a dopant of a second diffusion coefficient into the substrate, the dopant being implanted into the substrate with a certain angle from vertical against the substrate using a resist as a mask, the dopant being diffused in the substrate so as to form a source and such that in the semiconductor device, the dopant is diffused in only one side surface of the plural stacking layer proximate to the source and opposite another side surface of the plural stacking layer proximate to a drain, and
    h) implanting a dopant of the first diffusion coefficient vertically against the substrate after removing the resist to form the drain proximate to the another side surface of the plural stacking layers and to further form the source.

12. A semiconductor device including nonvolatile memories according to claim 11,
    wherein the first diffusion coefficient is smaller than the second diffusion coefficient.

13. A semiconductor device including nonvolatile memories according to claim 12,
    wherein the dopant of the first diffusion coefficient is arsenic, and wherein the dopant of the second coefficient of diffusion is phosphorous.

* * * * *

UNITED STATES PATENT AND TRADEMARK OFFICE
CERTIFICATE OF CORRECTION

PATENT NO.    :    5,446,298

DATED         :    AUGUST 29, 1995

INVENTOR(S)   :    KOJIMA

It is certified that error appears in the above-identified patent and that said Letters Patent is hereby corrected as shown below:

On the title page, change item:

" [21] Appl. No.: 300,984 " to -- [21] Appl. No.: 300,934. --

Signed and Sealed this

Twelfth Day of December, 1995

Attest:

BRUCE LEHMAN

Attesting Officer           Commissioner of Patents and Trademarks